(12) United States Patent
Arakawa

(10) Patent No.: US 9,275,848 B2
(45) Date of Patent: Mar. 1, 2016

(54) PROCESSING METHOD FOR OPTICAL DEVICE WAFER

(71) Applicant: DISCO CORPORATION, Tokyo (JP)

(72) Inventor: Taro Arakawa, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/554,479

(22) Filed: Nov. 26, 2014

(65) Prior Publication Data

US 2015/0159821 A1 Jun. 11, 2015

(30) Foreign Application Priority Data

Dec. 5, 2013 (JP) .................................. 2013-251981

(51) Int. Cl.
| | |
|---|---|
| *H01L 21/00* | (2006.01) |
| *B23K 26/00* | (2014.01) |
| *B23K 26/18* | (2006.01) |
| *B23K 26/38* | (2014.01) |
| *B23K 26/40* | (2014.01) |

(52) U.S. Cl.
CPC ............... *H01L 21/00* (2013.01); *B23K 26/00* (2013.01); *B23K 26/0087* (2013.01); *B23K 26/18* (2013.01); *B23K 26/385* (2013.01); *B23K 26/409* (2013.01); *B23K 26/4075* (2013.01)

(58) Field of Classification Search
None
See application file for complete search history.

(56) References Cited

U.S. PATENT DOCUMENTS

| | | | |
|---|---|---|---|
| 2009/0197395 A1* | 8/2009 | Nakamura et al. ............ | 438/463 |
| 2010/0136766 A1* | 6/2010 | Sakamoto et al. ............ | 438/463 |
| 2011/0256689 A1* | 10/2011 | Sekiya .......................... | 438/462 |

FOREIGN PATENT DOCUMENTS

| | | |
|---|---|---|
| JP | 10-305420 | 11/1998 |
| JP | 2006-024914 | 1/2006 |

* cited by examiner

*Primary Examiner* — Duy Deo
(74) *Attorney, Agent, or Firm* — Greer Burns & Crain Ltd.

(57) ABSTRACT

A method of processing an optical device wafer which includes a laser processing step of repeating an application of one pulse of a pulsed laser beam to the optical device wafer to form one laser processed hole, thereby forming a plurality of laser processed holes along streets; an etching step of causing an etchant to enter into the laser processed holes to etch the inside of the laser processed holes; and a dividing step of exerting an external force on the optical device wafer to divide the optical device wafer along the streets, thereby forming a plurality of optical devices.

2 Claims, 8 Drawing Sheets

PROCESSING METHOD FOR OPTICAL DEVICE WAFER

BACKGROUND OF THE INVENTION

1. Field of the Invention

The present invention relates to a processing method for dividing an optical device wafer into individual devices.

2. Description of the Related Art

In an optical device chip manufacturing process, light emitting devices such as light emitting diodes and laser diodes are formed respectively in regions partitioned by a plurality of crossing streets formed on a surface of a crystal growth substrate such as a sapphire substrate or a silicon carbide substrate, to produce an optical device wafer. Thereafter, electrodes are formed, and the optical device wafer is divided along the streets, to manufacture individual optical device chips.

In recent years, from the viewpoint of enhanced productivity, pulsed laser processing apparatuses have widely been used for dividing optical device wafers. In a pulsed laser processing apparatus, a pulsed laser beam is applied to the surface of an optical device wafer along streets to form laser processed grooves, and the optical device wafer is divided, with the laser processed grooves as start points of division, into individual chips (see, for example, Japanese Patent Laid-open No. Hei 10-305420). When laser processing is applied to an optical device wafer as above, strain is generated in side surfaces of the laser processed grooves. In view of this, there has been proposed, for example in Japanese Patent Laid-open No. 2006-024914, a method for removing such strain by subjecting the optical device wafer to dry etching or wet etching prior to division of the optical device wafer, whereby the optical device chips manufactured are enhanced in brightness.

SUMMARY OF THE INVENTION

The laser processed grooves formed by the laser processing, however, have a narrow width of 10 μm or less, for example. In addition, a large amount of debris generated upon the laser processing is deposited on internal surfaces of the laser processed grooves. Therefore, it is difficult for an etchant to enter into the grooves. Accordingly, it may be impossible to achieve sufficient etching of the laser processed grooves ranging to the groove bottoms, so that the optical devices thus manufactured may fail to show enhanced brightness.

In view of the foregoing, it is an object of the present invention to provide a method of processing an optical device wafer by which optical devices can be more enhanced in brightness.

In accordance with an aspect of the present invention, there is provided a method of processing an optical device wafer having an optical device layer stacked on a front surface of a substrate, the optical device layer being sectioned into regions partitioned by a plurality of crossing streets, and an optical device being formed in each of the regions, the method including: a laser processing step of repeating an application of a pulsed laser beam of such a wavelength as to be absorbable in the optical device wafer to the optical device wafer to form one laser processed hole by one pulse, thereby forming a plurality of laser processed holes along the streets; an etching step of causing, after execution of the laser processing step, an etchant to enter into the laser processed holes, thereby etching internal surfaces of the laser processed holes; and a dividing step of exerting, after execution of the etching step, an external force on the optical device wafer to divide the optical device wafer along the streets, thereby forming a plurality of optical device chips.

Preferably, the method further includes a protective film forming step of forming, before execution of the laser processing step, a protective film on the front surface of the optical device wafer, and a protective film removing step of removing the protective film at least after execution of the laser processing step, and, in the laser processing step, the pulsed laser beam is applied toward the front surface side of the optical device wafer.

In the method of processing an optical device wafer according to the described aspect of the present invention, the laser processing step of forming one laser processed hole by one pulse of the pulsed laser beam is repeated to form a plurality of laser processed holes along the streets. Therefore, deposition of a large amount of debris on the internal surface of each laser processed hole can be restrained. This ensures that in the etching step after execution of the laser processing step, the etchant can be made to sufficiently enter into the laser processed holes, whereby the laser processed holes can be sufficiently etched to the bottoms of the holes. Consequently, the brightness exhibited by the optical devices obtained can be enhanced.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
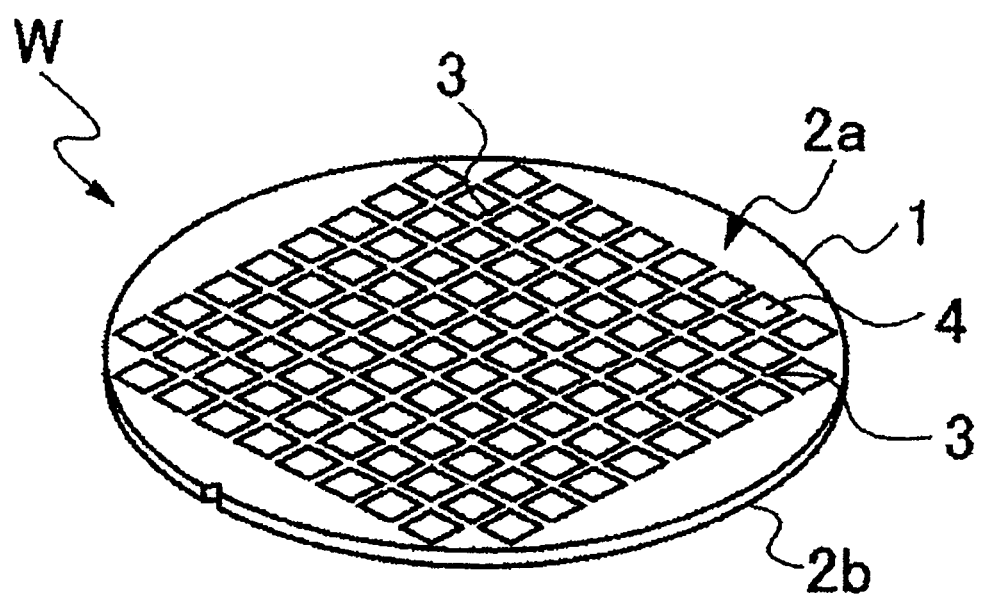
FIG. 1 is a perspective view showing an example of an optical device wafer.
Figure 2:
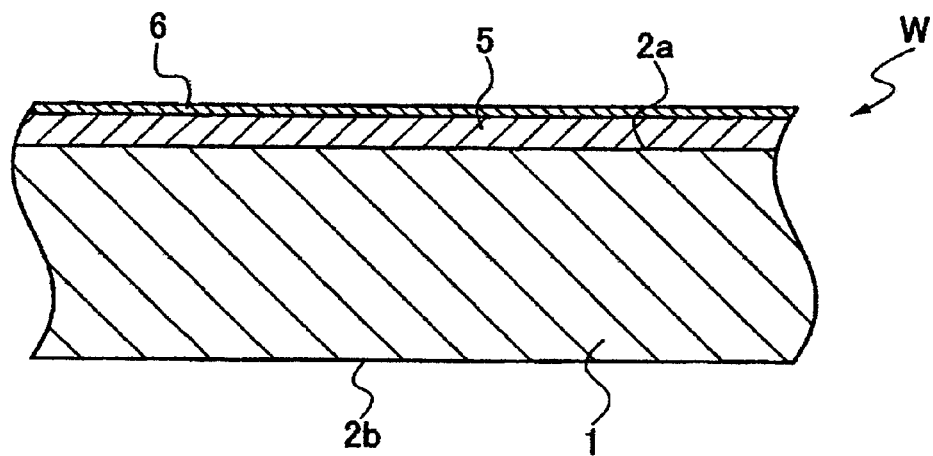
FIG. 2 is a sectional view illustrating a protective film forming step.

An optical device wafer W shown in FIG. 1 is an example of a workpiece, which includes a circular sapphire substrate 1. As illustrated in FIG. 2, a light emitting layer 5 such as LEDs is stacked on a front surface 2a of the sapphire substrate 1, and an optical device 4 is formed in each of regions partitioned by streets 3 which are formed in a grid pattern as depicted in FIG. 1. On the other hand, a back surface 2b of the sapphire substrate 1 is a grinding surface to be ground, on which no optical device 4 is formed. A processing method for dividing the optical device wafer W into the individual optical devices 4 will be described below, referring to the attached drawings.

(1) Protective Film Forming Step

As illustrated in FIG. 2, a protective film 6 is formed which covers the light emitting layer 5 stacked on the front surface 2a of the sapphire substrate 1 constituting the optical device wafer W. The protective film 6 is composed of an oxide film, e.g. SiO$_2$ film, or a resist. The protective film forming step is carried out at least before a laser processing step (described later) is conducted.

(2) Laser Processing Step

Figure 3:
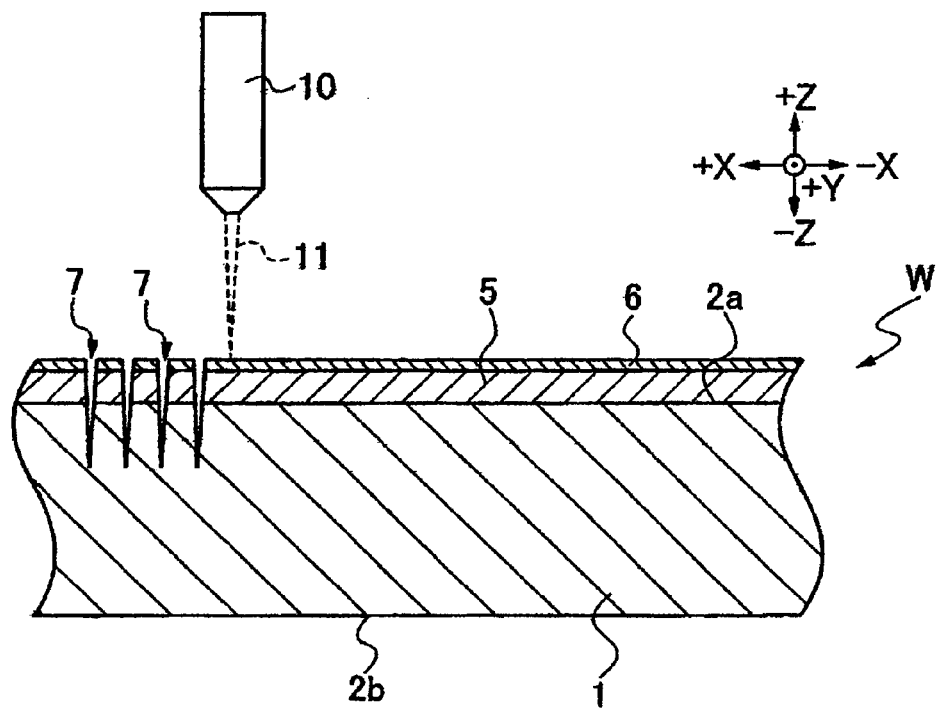
FIG. 3 is a sectional view illustrating a laser processing step.

After the protective film forming step is conducted, a laser beam is applied to the optical device wafer W by laser beam irradiation means 10, to form laser processed holes, as illustrated in FIG. 3. While the optical device wafer W formed thereon with the protective film 6 is moved in a horizontal direction (+X direction), the laser beam irradiation means 10 applies a pulsed laser beam 11 of such a wavelength (e.g., a wavelength of 355 nm) as to be absorbable in the optical device wafer W toward the front surface 2a of the sapphire substrate 1. In this instance, the laser beam irradiation means 10 forms one laser processed hole 7 by one pulse of the pulsed laser beam 11, without any overlapping of irradiation spots of the pulsed laser beam 11.

Figure 4:
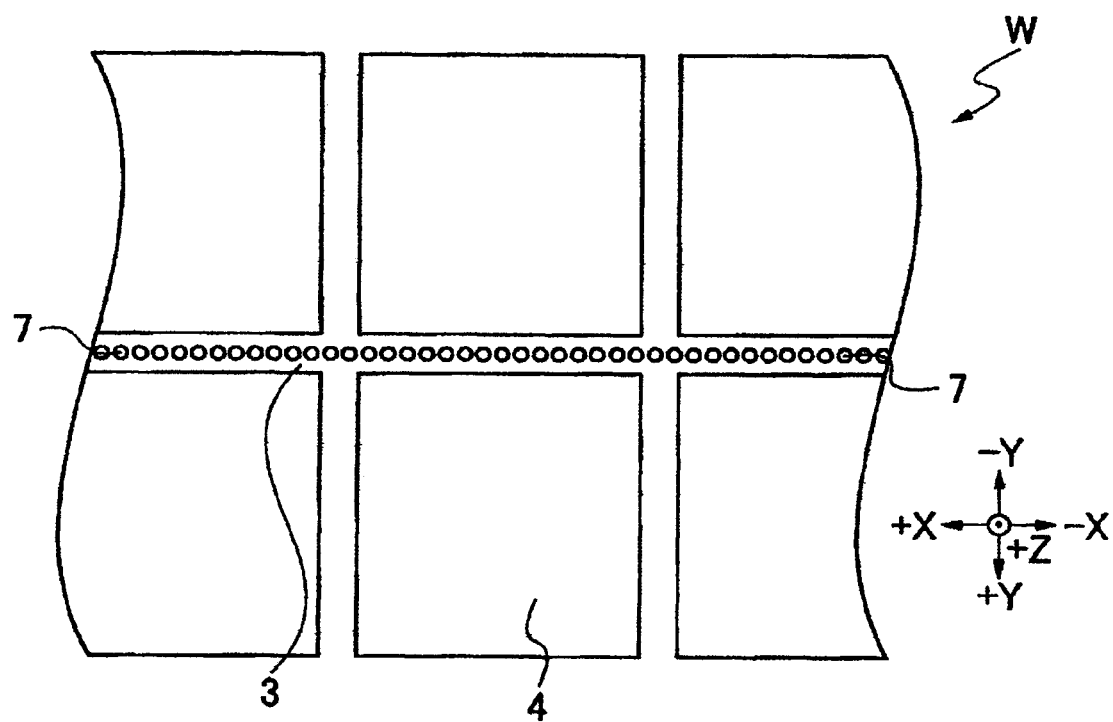
FIG. 4 is a plan view illustrating the laser processing step.

The laser beam irradiation means 10 repeats intermittently the formation of one laser processed hole 7 by the application of one pulse of the pulsed laser beam 11, whereby a plurality of the laser processed holes 7 are formed at a predetermined interval along the streets 3 of the optical device wafer W, as illustrated in FIG. 4. The interval of the laser processed hole 7 is, for example, about 1 to 5 µm. In the case where a straight line-shaped laser processed groove is formed along each of streets as in the related art, irradiation spots of the pulsed laser beam should be set to partly overlap each other. In such a case, debris generated upon application of the pulsed laser beam deposits on the inside of a groove having been formed by the previous pulsed laser beam, resulting in that a large amount of debris accumulates on internal side walls of the laser processed grooves. Where the plurality of laser processed holes 7 are formed in the front surface 2a of the sapphire substrate 1, on the other hand, partial overlapping of the irradiation spots is unnecessary, so that the possibility that the debris generated during laser processing deposits on the inside of the laser processed holes 7 can be lowered. In addition, since the light emitting layer 5 is covered with the protective film 6, upon application of the pulsed laser beam toward the front surface side of the optical device wafer W, the debris deposits on the protective film 6, without depositing on the light emitting layer 5 at all.

Figure 5:
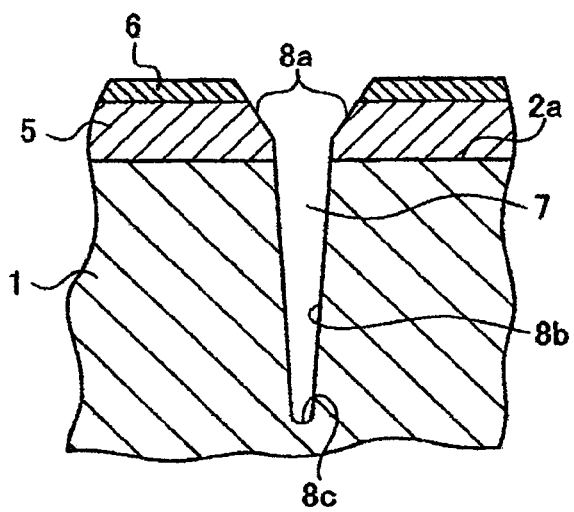
FIG. 5 is a sectional view showing a configuration of a laser processed hole.

At the time of forming the laser processed hole 7, it is desirable to form an inclined taper portion 8a at a hole portion where the pulsed laser beam 11 is incident, as in the laser processed hole 7 depicted in FIG. 5. This is realized by controlling the incidence angle of the pulsed laser beam 11 through regulating the spot diameter and the converging position (focal point) of the pulsed laser beam 11 applied by the laser beam irradiation means 10.

As shown in FIG. 5, the laser processed hole 7 is formed with a side wall portion 8b adjacent to the taper portion 8a, and a bottom portion 8c adjacent to the side wall portion 8b. Incidentally, the laser processed hole 7 has a maximum diameter of, for example, 2 to 5 µm, and a depth of, for example, 20 µm. When the plurality of laser processed holes 7 have thus been formed by the application of the pulsed laser beam 11 along all the streets 3 of the optical device wafer W shown in FIG. 1, the laser processing step is finished.

(3) Etching Step

Figure 6:
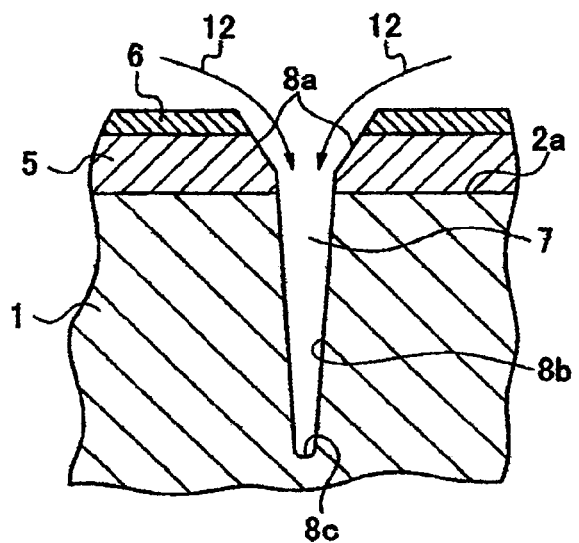
FIG. 6 is a sectional view illustrating an etching step.

After the laser processing step is carried out, wet etching is conducted by supplying an etchant 12 into the inside of the laser processed holes 7, as illustrated in FIG. 6. As the etchant 12, there can be used, for example, sulfuric acid, phosphoric acid, hydrochloric acid and the like. When the etchant 12 is supplied into the laser processed hole 7, the inclination of the taper portion 8a of the laser processed hole 7 permits the etchant 12 to easily enter into the inside of the laser processed hole 7. Therefore, the etchant 12 flows downward along the side wall portion 8b of the laser processed hole 7. In addition, since there is no debris piled up by deposition on the side wall portion 8b of the laser processed hole 7, the etchant 12 flows to reach the bottom portion 8c of the laser processed hole 7. As a result, not only the side wall portion 8b but also the bottom portion 8c of the laser processed hole 7 can be sufficiently etched.

(4) Protective Film Removing Step

Figure 7:
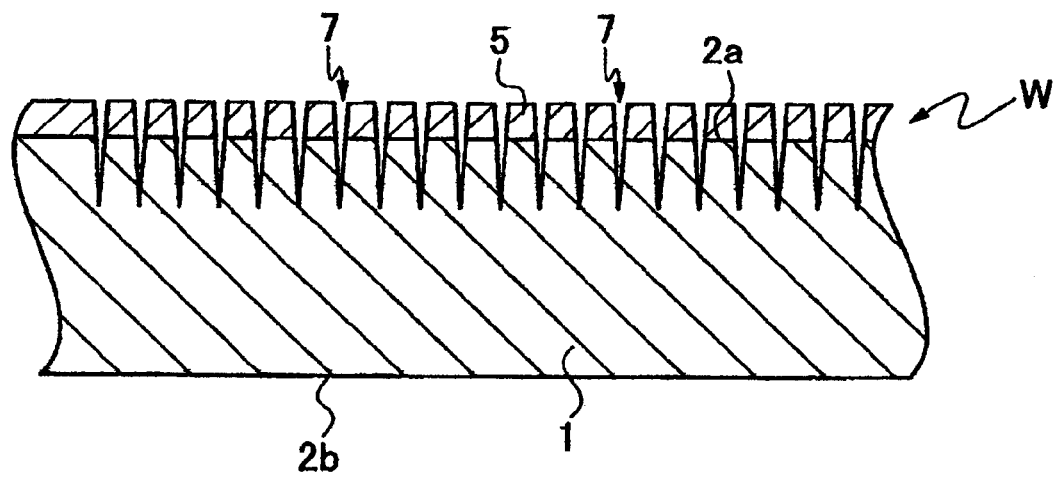
FIG. 7 is a sectional view illustrating a protective film removing step.

Next, the protective film 6 formed on the front surface 2a side of the sapphire substrate 1 as in the optical device wafer W depicted in FIG. 6 is removed, whereby the light emitting layer 5 stacked on the front surface 2a of the sapphire substrate 1 is exposed to the upper side, as illustrated in FIG. 7. The method for removing the protective film 6 is not specifically restricted. For example, where the protective film 6 is a resist film, an oxygen plasma or a remover for exclusive use can be used. Where the protective film 6 is a SiO$_2$ film, the protective film 6 can be removed by wet etching using KOH, dry etching using SF6, or the like. The protective film removing step is carried out at least after the laser processing step is executed. By the removal of the protective film 6, the debris deposited on the protective film 6 upon the laser processing step is also removed.

(5) Grinding Step

Figure 8:
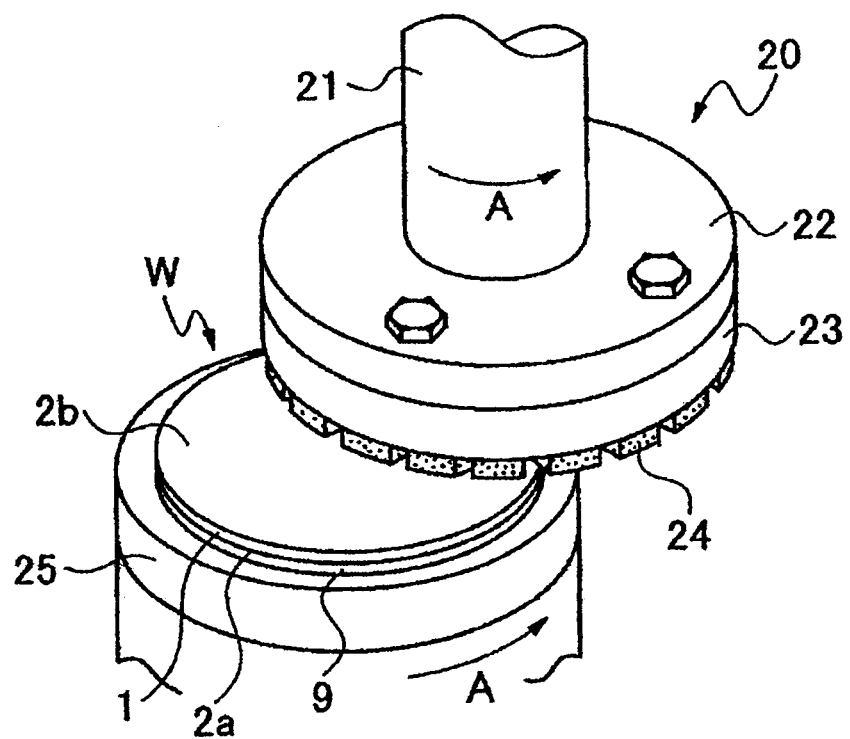
FIG. 8 is a perspective view illustrating a grinding step.

After the protective film removing step is carried out, the optical device wafer W is ground by grinding means 20 depicted in FIG. 8. The grinding means 20 includes, at least: a spindle 21 having a vertical axis; a grinding wheel 23 connected to the lower end of the spindle 21 by way of a mount 22; and grindstones 24 attached to a lower portion of the grinding wheel 23 in an annular pattern. With the spindle 21 rotated by a motor which is not illustrated, the grinding wheel 23 can be rotated at a predetermined rotational speed.

For thinning the optical device wafer W, a surface protective tape 9 is affixed to the front surface 2a of the sapphire substrate 1, the sapphire substrate 1 is put on an upper surface of a holding table 25, with the surface protective tape 9 contacting the upper surface of the holding table 25 and with the back surface 2b of the sapphire substrate 1 up, and the sapphire substrate 1 is suction held onto the holding table 25 by a suction source which is not depicted. Subsequently, while rotating the holding table 25 in the direction of arrow A, for example, and while rotating the spindle 21 to rotate the grinding wheel 23 in the direction of arrow A, the grinding means 20 is lowered in the direction of approaching the back surface 2b of the sapphire substrate 1. In this manner, the back surface 2b is ground while pressing the grindstones 24 against the back surface 2b until the optical device wafer W is thinned to a predetermined thickness.

Figure 9:
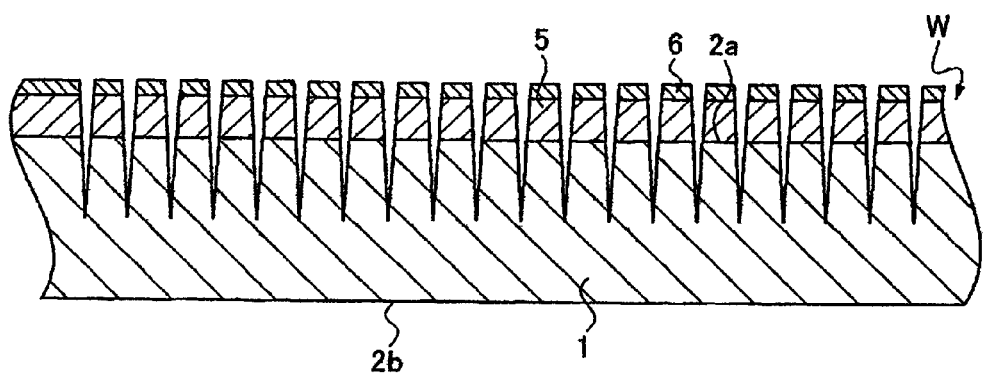
FIG. 9 is a sectional view depicting an optical device wafer after grinding.

In another example of the grinding step, the protective film 6 shown in FIG. 2 may be used as a protective film during grinding of the optical device wafer W. In this case, before carrying out the protective film removing step, the sapphire substrate 1 is put on the upper surface of the holding table 25 depicted in FIG. 8, with the protective film 6 contacting the upper surface of the holding table 25 and with the back surface 2b of the sapphire substrate 1 up, and the back surface 2b of the sapphire substrate 1 is ground by the grinding means 20 in the same manner as aforementioned. After the back surface 2b of the sapphire substrate 1 is ground until the sapphire substrate 1 is thinned to a predetermined thickness, as shown in FIG. 9, the protective film 6 is removed from the front surface 2a of the sapphire substrate 1.

(6) Dividing Step

Figure 10:
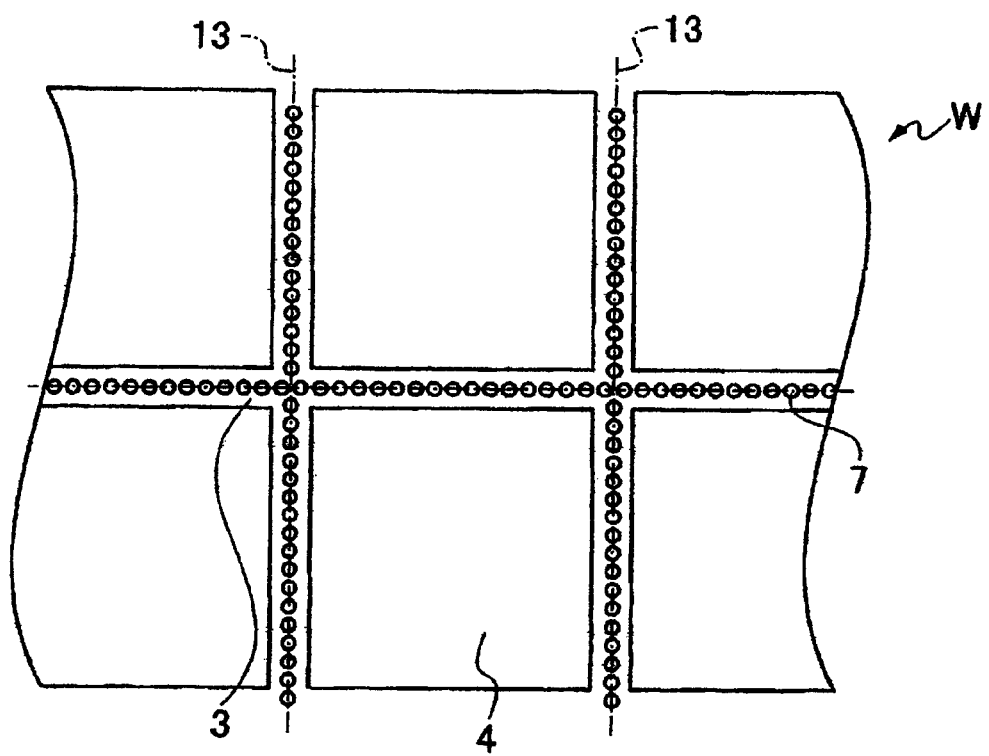
FIG. 10 is a plan view illustrating a dividing step.

Next, illustrated in FIG. 10, the optical device wafer W is divided into the individual optical devices 4 by breaking. While the array directions of the plurality of laser processed holes 7 formed along the crossing streets 3 are used as dividing positions 13, an external force is exerted on the optical device wafer W to cut up the optical device wafer W, with the dividing positions 13 as start points of division, into the individual optical devices 4. When the optical device wafer W has thus been divided into the individual optical devices 4, the dividing step is finished.

As has been described above, in the method of processing an optical device wafer according to the described aspect of the present invention, the formation of one laser processed hole 7 by one pulse of the pulsed laser beam 11 is repeated in the laser processing step at a predetermined interval along the streets 3 on the front surface 2a of the sapphire substrate 1. Therefore, piling up of a large amount of debris by deposition on the side wall portions 8b of the laser processed holes 7 can be restrained.

In addition, at the time of carrying out the etching step after execution of the laser processing step, the laser processed holes 7 have the taper portions 8a formed therein. This permits the etchant 12 to easily enter into the inside of the laser processed holes 7. In addition, that portion of each laser processed hole 7 which ranges from the side wall portion 8b to the bottom portion 8c can be effectively etched by virtue of the entering of the etchant 12 thereto. Consequently, a further enhancement of the brightness exhibited by the optical devices 4 obtained can be realized.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing an optical device wafer having an optical device layer stacked on a front surface of a substrate, the optical device layer being sectioned into regions partitioned by a plurality of crossing streets, and an optical device being formed in each of the regions, the method comprising:
    a laser processing step of repeating an application of a pulsed laser beam of such a wavelength as to be absorbable in the optical device wafer to the optical device wafer to form one laser processed hole by one pulse, thereby forming a plurality of laser processed holes along the streets;
    an etching step of causing, after execution of the laser processing step, an etchant to enter into the laser processed holes, thereby etching internal surfaces of the laser processed holes; and
    a dividing step of exerting, after execution of the etching step, an external force on the optical device wafer to divide the optical device wafer along the streets, thereby forming a plurality of optical device chips.

2. The method of processing the optical device wafer according to claim 1, further comprising:
    a protective film forming step of forming, before execution of the laser processing step, a protective film on the front surface of the optical device wafer; and
    a protective film removing step of removing the protective film, at least after execution of the laser processing step,
    wherein in the laser processing step the pulsed laser beam is applied toward the front surface side of the optical device wafer.

* * * * *